US010293376B2

(12) United States Patent
Jin et al.

(10) Patent No.: US 10,293,376 B2
(45) Date of Patent: May 21, 2019

(54) BENDER BAR TRANSDUCER WITH AT LEAST THREE RESONANCE MODES

(71) Applicant: Halliburton Energy Services, Inc., Houston, TX (US)

(72) Inventors: Jing Jin, Singapore (SG); Chung Chang, Houston, TX (US)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 88 days.

(21) Appl. No.: 15/028,161

(22) PCT Filed: Jun. 5, 2014

(86) PCT No.: PCT/US2014/041128
§ 371 (c)(1),
(2) Date: Apr. 8, 2016

(87) PCT Pub. No.: WO2015/187166
PCT Pub. Date: Dec. 10, 2015

(65) Prior Publication Data
US 2016/0288167 A1    Oct. 6, 2016

(51) Int. Cl.
*G01V 1/46* (2006.01)
*H01L 41/16* (2006.01)
(Continued)

(52) U.S. Cl.
CPC .......... *B06B 1/0603* (2013.01); *B06B 1/0207* (2013.01); *G01V 1/159* (2013.01);
(Continued)

(58) Field of Classification Search
CPC ... B06B 1/0603; B06B 1/0207; E21B 47/101; E21B 47/26; E21B 47/12; E21B 47/16;
(Continued)

(56) References Cited

U.S. PATENT DOCUMENTS 3,360,664 A    12/1967  Straube
3,370,187 A *  2/1968  Straube ................. B06B 1/0603
                                                          310/330
(Continued)

FOREIGN PATENT DOCUMENTS

WO    WO 2012/034071 A1    3/2012

OTHER PUBLICATIONS

International Search Report and the Written Opinion of the International Search Authority, or the Declaration, dated Feb. 27, 2015, PCT/US2014/041128, 18 pages, ISA/KR.
(Continued)

*Primary Examiner* — Ian J Lobo

(57) ABSTRACT

A bender bar acoustic transducer capable of exciting at least three resonance modes is provided. The provided bender bar acoustic transducer may be capable of exciting a second resonance mode by configuring a first portion of a piezoelectric element to contract while a second portion of the piezoelectric element expands when voltage is applied to electrodes coupled to the piezoelectric element. The bender bar acoustic transducer may be further configured such that the first portion and the second portion of the piezoelectric element both contract and/or expand to excite a first resonance mode. The bender bar acoustic transducer may be used in downhole and well logging applications.

25 Claims, 10 Drawing Sheets

(51) Int. Cl.
*B06B 1/06* (2006.01)
*G01V 1/02* (2006.01)
*B06B 1/02* (2006.01)
*H01L 41/047* (2006.01)
*G01V 1/52* (2006.01)
*G01V 1/44* (2006.01)

(52) U.S. Cl.
CPC .............. *G01V 1/46* (2013.01); *H01L 41/047* (2013.01); *H01L 41/16* (2013.01); *B06B 1/0614* (2013.01); *G01V 1/44* (2013.01); *G01V 2001/526* (2013.01)

(58) Field of Classification Search
CPC .......... G01V 1/44; G01V 1/159; H01L 41/18; H04R 17/00
See application file for complete search history.

(56) References Cited

U.S. PATENT DOCUMENTS

| | | | | |
|---|---|---|---|---|
| 4,140,936 A | * | 2/1979 | Bullock | H01L 41/0933 310/328 |
| 4,782,910 A | * | 11/1988 | Sims | B06B 1/0603 181/106 |
| 4,899,844 A | | 2/1990 | Katahara et al. | |
| 4,949,316 A | * | 8/1990 | Katahara | G01H 11/06 310/334 |
| 5,001,681 A | | 3/1991 | Bertoldi et al. | |
| 5,042,611 A | * | 8/1991 | Howlett | B06B 1/0618 181/102 |
| 5,081,391 A | * | 1/1992 | Owen | B06B 1/0655 310/328 |
| 5,225,731 A | * | 7/1993 | Owen | H01L 41/092 310/357 |
| 5,677,894 A | * | 10/1997 | Erath | B06B 1/0622 310/337 |
| 5,815,466 A | * | 9/1998 | Erath | G01H 11/08 310/331 |
| 9,541,657 B2 | * | 1/2017 | Mandal | H01L 41/0933 |
| 2005/0152219 A1 | | 7/2005 | Garcia-Osuna | |
| 2008/0079331 A1 | * | 4/2008 | Butler | B06B 1/0603 310/331 |
| 2009/0038848 A1 | | 2/2009 | Garcia-Osuna | |
| 2010/0097681 A1 | | 4/2010 | Klose et al. | |
| 2010/0165794 A1 | | 7/2010 | Takahashi et al. | |
| 2012/0324993 A1 | | 12/2012 | Nakajima et al. | |

OTHER PUBLICATIONS

European Search Report issued for Patent Application No. 14893989.5, dated Feb. 15, 2018, 12 pages.

\* cited by examiner

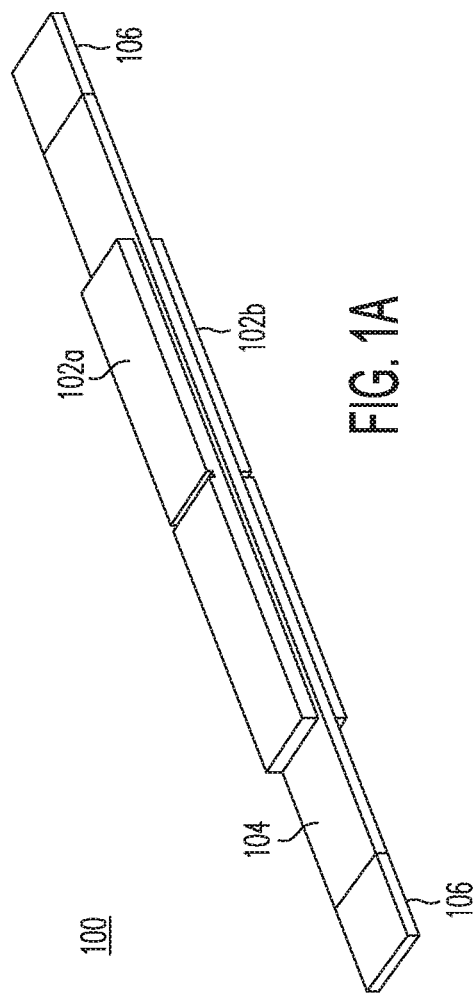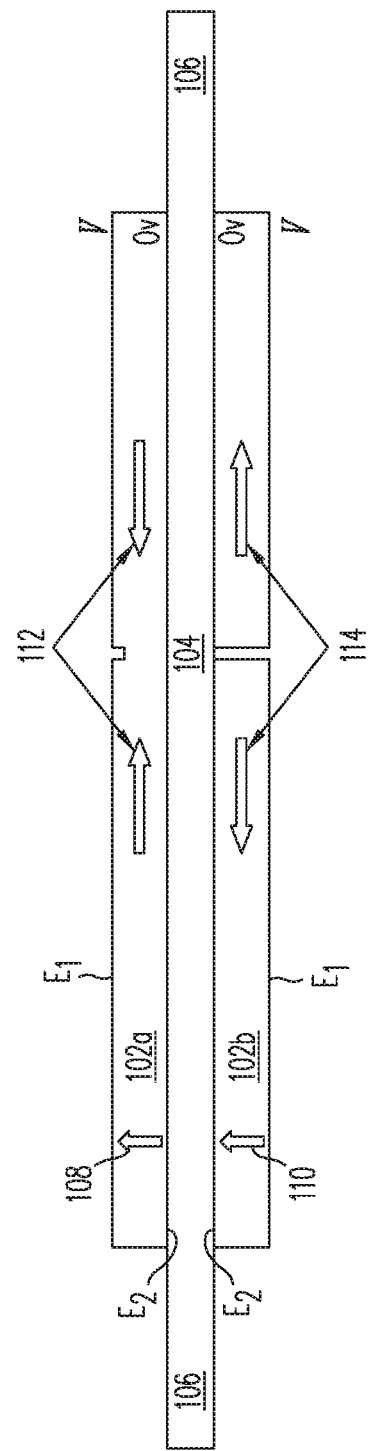
FIG. 1A
FIG. 1B

BENDER BAR TRANSDUCER WITH AT LEAST THREE RESONANCE MODES

The present application is a U.S. National Stage patent application of International Patent Application No. PCT/US2014/041128, filed on Jun. 5, 2014, the benefit of which is claimed and the disclosure of which is incorporated herein by reference in its entirety.

TECHNICAL FIELD

Embodiments disclosed herein are related to acoustic logging. In particular, embodiments herein are related to bender bar transducers.

BACKGROUND

An acoustic logging tool used in a subterranean drilling operation typically includes an acoustic source (transmitter), and a set of receivers that are spaced several inches or feet apart. The logging tool may be lowered into a borehole in a subterranean formation by a wireline or conventional drilling assembly, for example, where it may transmit an acoustic signal from the acoustic source and receive the signal or its echo at the receivers of the tool. Bender bars have been utilized in wireline tools to either detect or to generate acoustic vibrations. However, current bender bars are limited in the amount of acoustic pressure or energy that they can produce.

BRIEF DESCRIPTION OF THE DRAWINGS

FIGS. 1A and 1B are diagrams illustrating a bender bar transducer, in accordance with some embodiments.

DETAILED DESCRIPTION

Figure 2A:
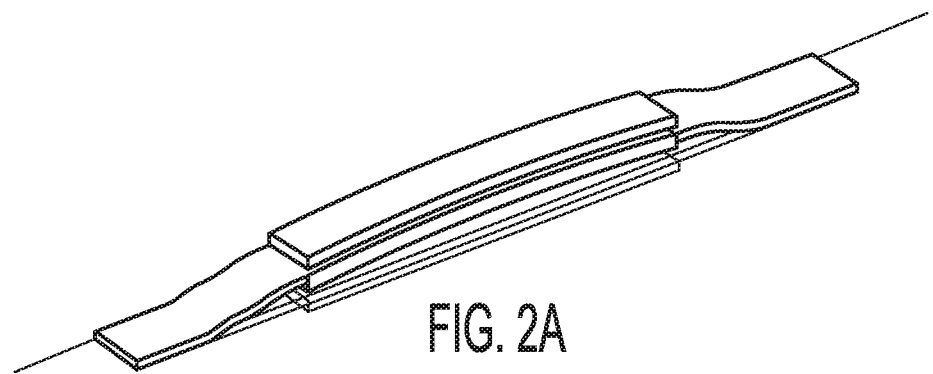
FIGS. 2A-2C are diagrams illustrating resonant modes of a bender bar, consistent with some embodiments.

Illustrative embodiments and related methodologies of the present disclosure are described below as they might be employed in a bender bar having improved acoustic pressure and energy output. In the interest of clarity, not all features of an actual implementation or methodology are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure. Further aspects and advantages of the various embodiments and related methodologies of the disclosure will become apparent from consideration of the following description and drawings.

Consistent with some embodiments, there is provided an acoustic transducer. The acoustic transducer may include a substrate element, a first piezoelectric element coupled to a first side of the substrate element, the first piezoelectric element comprising a first portion and a second portion. The acoustic transducer may also include a second piezoelectric element coupled to a second side of the substrate element, the second piezoelectric element comprising a first portion and a second portion. In one or more preferred embodiments, the substrate is formed of an inert or non-piezoelectric material.

Consistent with some embodiments, there is also provided a method utilizing an acoustic logging tool within a borehole. The method includes steps of deploying the acoustic logging tool into the borehole, exciting at least a first, second, and third resonance modes of the acoustic logging tool to produce an acoustic force along the borehole, and processing a received acoustic response to the produced acoustic force to determine properties of formations surrounding the borehole. One or more steps of the method may be embodied in computer-readable media.

FIGS. 1A and 1B are diagrams illustrating a bender bar transducer 100, in accordance with some embodiments. As shown in FIG. 1A, bender bar transducer 100 includes piezoelectric elements 102a and 102b attached to opposite sides of a non-piezoelectric element 104. The non-piezoelectric element 104 may be a substrate and may have fixed ends 106 (attached to a supporting structure, not shown). Piezoelectric elements 102a and 102b may be attached to non-piezoelectric element 104 using bonding, affixing, and the like, such that piezoelectric elements 102a and 102b share an electrical ground at the surfaces bonded to non-piezoelectric element 104. Piezoelectric elements 102a and 102b are formed of piezoelectric material each include a set of electrodes $E_1$, $E_2$, typically added or otherwise applied to the outer surfaces of the piezoelectric material during manufacture for receiving a voltage and producing an electric field in the piezoelectric material.

As shown in FIG. 1B, piezoelectric element 102a may be polarized in a first direction away from non-piezoelectric element 104, as shown by arrow 108, and piezoelectric element 102b may be polarized in the same direction which, due to the orientation of piezoelectric element 102b, is towards non-piezoelectric element 104, as shown by arrow 110. When an alternating voltage V is applied to the electrodes $E_1$, $E_2$ on the outer surfaces of piezoelectric element 102a and piezoelectric element 102b, a first piezoelectric stress indicated by arrows 112 may be induced in piezoelectric element 102a, and a second piezoelectric stress indicated by arrows 114 may be induced in piezoelectric element 1002b. As a result of the induced stresses, piezoelectric element 102a may contract while piezoelectric element 102b may expand as alternating voltage V is applied over time. The expansion and contraction of piezoelectric elements 102a and 102b over time may cause non-piezoelectric element 104 to bend over time such that bender bar transducer 100 vibrates at the frequency of alternating voltage V.

Figure 2B:
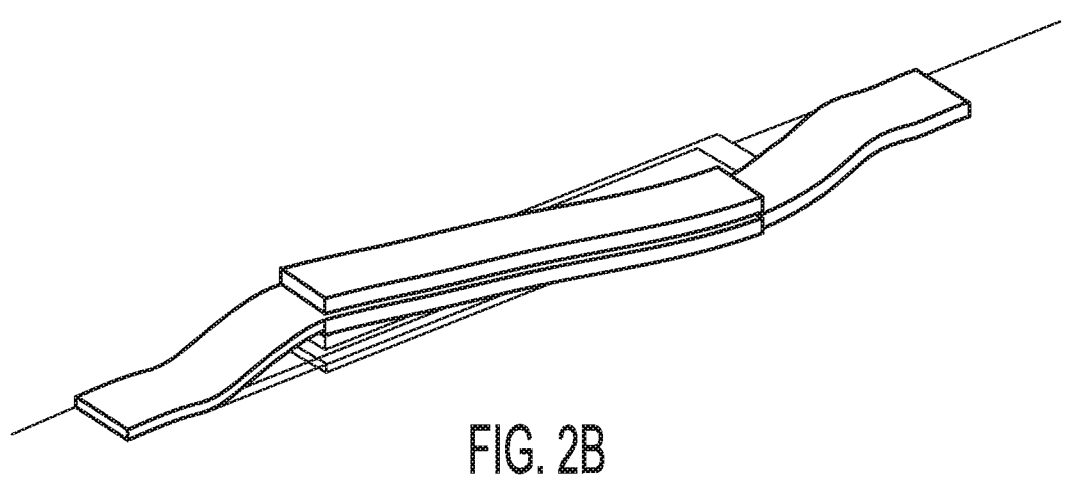
Figure 2C:
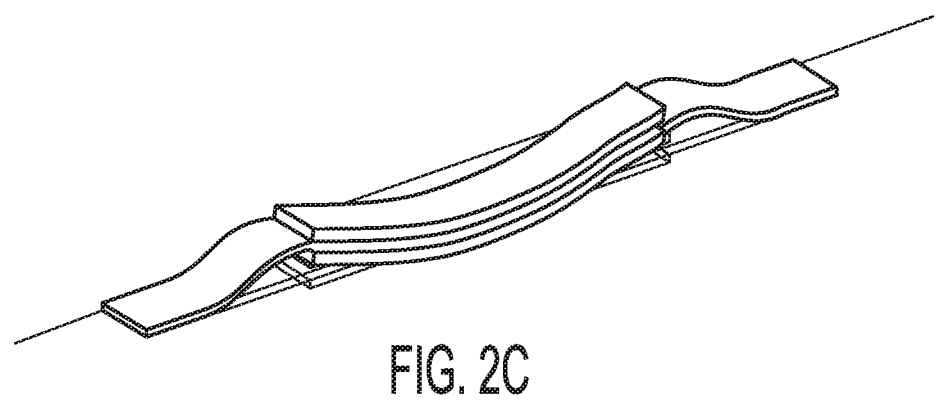

FIGS. 2A-2C are diagrams illustrating resonant modes of bender bar transducer 100, consistent with some embodiments. As shown in FIGS. 2A and 2C, applying alternating voltage V to the electrodes $E_1$, $E_2$ of each piezoelectric element 102a and 102b (cf. FIG. 1B) drives non-piezoelectric element 104 to bend sufficiently to cause bender bar 100 to vibrate at the first (FIG. 2A) and third (FIG. 2C) resonant modes associated with the frequency of alternating voltage V as bender bar transducer 100 vibrates. However, as shown in FIG. 2B, the lateral motion associated with the second resonance mode makes exciting the second resonance mode difficult based on the construction of the bender bar. Moreover, since the second resonance frequency mode (FIG. 2B) is not easily produced by the application of alternating voltage V to piezoelectric elements 102a and 102b, bender bar transducer 100 does not generate much if any acoustic energy or pressure from the second resonance mode, and most of the vibration and, thus, acoustic energy or pressure of bender bar transducer 100 is from the first (FIG. 2A) and third (FIG. 2C) resonance modes. However, since there is a wide gap between the frequency of the first resonance mode and the third resonance, the amount of acoustic energy or pressure generated by bender bar transducer 100 may limit the usefulness of bender bar 100 as an acoustic transducer.

Figure 3:
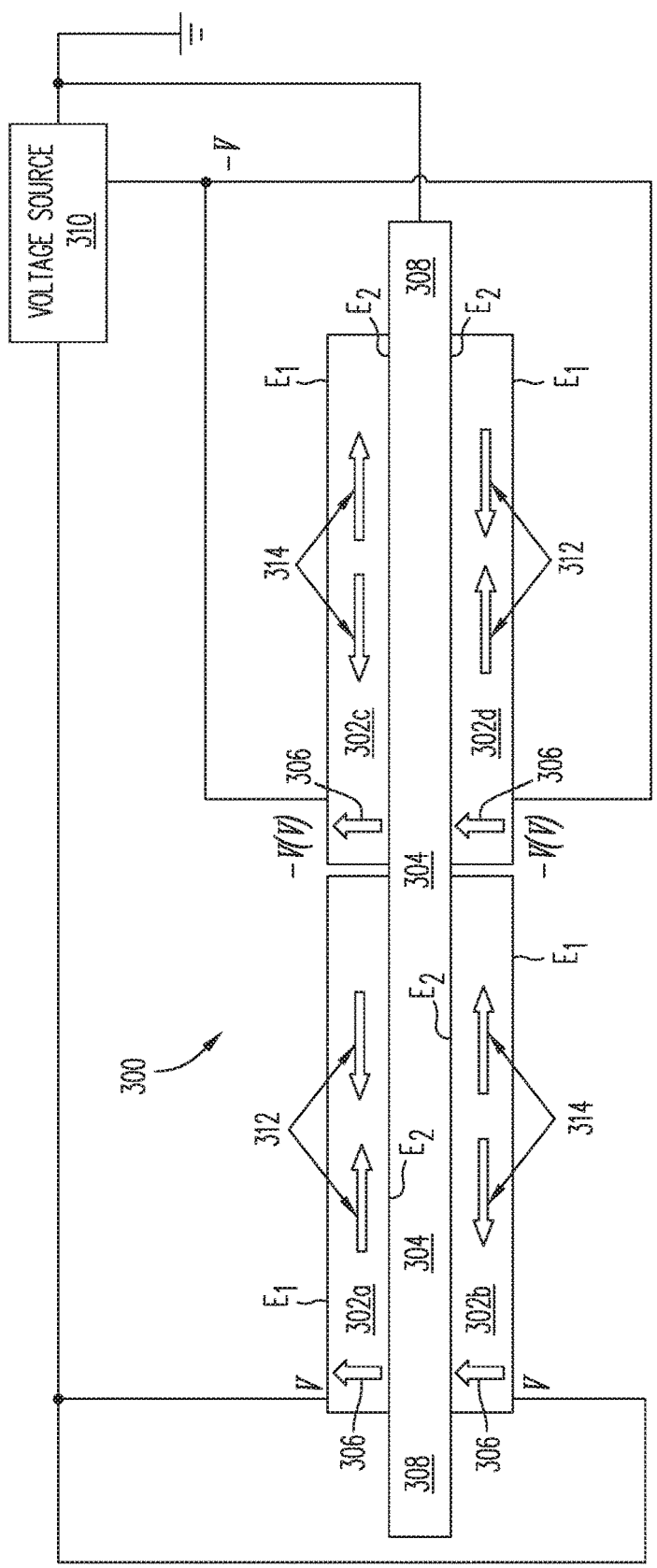
FIG. 3 is a diagram illustrating a cross-section of a bender bar transducer having four piezoelectric elements, consistent with some embodiments.

FIG. 3 is a diagram illustrating a cross-section of a bender bar transducer 300 having four piezoelectric elements or portions 302a-d, consistent with some embodiments. As shown in FIG. 3, bender bar transducer 300 includes piezoelectric elements portions 302a-d attached to substrate element 304. In some embodiments, substrate element 304 is formed of non-piezoelectric material. In some embodiments, substrate element 304 may be a metallic substrate including or consisting of brass, titanium, copper, steel, aluminum, or Inconel®. Other non-piezoelectric materials may be used for substrate element 304 in some embodiments. Moreover, substrate element 304 may be formed of an inert material in some embodiments. Each piezoelectric element or portion 302a-302d includes a thin conductive layer on the surfaces of the piezoelectric material forming the piezoelectric element 302 so that the piezoelectric element 302 can be characterized as having a set of electrodes $E_1$, $E_2$, for receiving a voltage and producing an electric field in the piezoelectric material. Piezoelectric elements 302a-d may be formed of any kind of piezoelectric material, including but not limited to lead zirconate titanate (PZT), barium titanate ($BaTiO_3$), gallium orthophosphate ($GaPO_4$), tourmaline, and quartz. Piezoelectric elements 302a-d may have a polarization shown by arrow 306. In some embodiments, pairs of electrodes $E_1$, $E_2$ for a piezoelectric element 302 may include a common electrode or, in other embodiments, all electrodes may be separate and distinct. For example, in some embodiments, $E_2$ for adjacent piezoelectric elements 302a, 302c may be the same or a common electrode, while electrodes $E_1$ of adjacent piezoelectric elements 302a, 302c are separate and distinct from one another.

Substrate element 304 may have fixed ends 308 on either end of substrate element 304, which fixed ends 308 are attached to a supporting structure (not shown). Moreover, a voltage source 310 may be coupled to bender bar transducer 300 to provide an alternating voltage V, with V provided to piezoelectric elements 302a and 302b, and −V, the anti-phase voltage or V, the same phase voltage, provided to piezoelectric elements 302c and 302d, oscillating at a frequency f. In some embodiments, the voltage may be a voltage between about 100 V and about 10,000 V oscillating at a frequency f of about 500 Hz to about 10 kHz. In some embodiments, voltage V may have a frequency between about 500 Hz and about 6 kHz.

As shown in FIG. 3, voltage source 310 may be coupled to bender bar transducer 300 via each set of electrodes $E_1$, $E_2$, to provide the voltage V to each respective piezoelectric elements 302a-d, and the anti-phase voltage −V to each respective piezoelectric elements 302c and 302d. When voltage V applied on piezoelectric elements 302a and 302b is positive, a first piezoelectric stress indicated by arrows 312 may be induced in piezoelectric element 302a, and a second piezoelectric stress indicated by arrows 314 may be induced in piezoelectric element 302b causing piezoelectric element 302a to contract while piezoelectric element 302b expands. Applying anti-phase voltage −V to piezoelectric elements 302c and 302d induces second piezoelectric stress indicated by arrows 314 in piezoelectric element 302c, and first piezoelectric stress indicated by arrows 312 in piezoelectric element 302d causing piezoelectric element 302d to contract while piezoelectric element 302c expands. The expansion of piezoelectric elements 302b and 302c and the contraction of piezoelectric elements 302a and 302d over time may cause substrate element 304 to bend over time such that bender bar transducer 300 vibrates at the frequency f. Moreover, the vibration caused by the expansion of piezoelectric elements 302b and 302c and the contraction of piezoelectric elements 302a and 302d excites the second resonance mode shown in FIG. 2B.

Applying same phase voltage V to piezoelectric elements 302c and 302d may then produce the same vibrations as in FIG. 1 to excite the first and third resonance modes shown in FIGS. 2A and 2C. Consequently, by alternating the application of voltage V and anti-phase voltage −V to piezoelectric elements 302c and 302d while applying voltage V to piezoelectric elements 302a and 302b, at least three resonance modes may be excited in bender bar transducer 300. By exciting at least three resonance modes in bender bar transducer 300, bender bar transducer 300 may produce additional acoustic energy or pressure than bender bar 100, which may allow for greater utility of bender bar transducer 300 in acoustic applications. Although, only three modes are discussed as being excited, other modes may also be excited in some embodiments.

Figure 4:
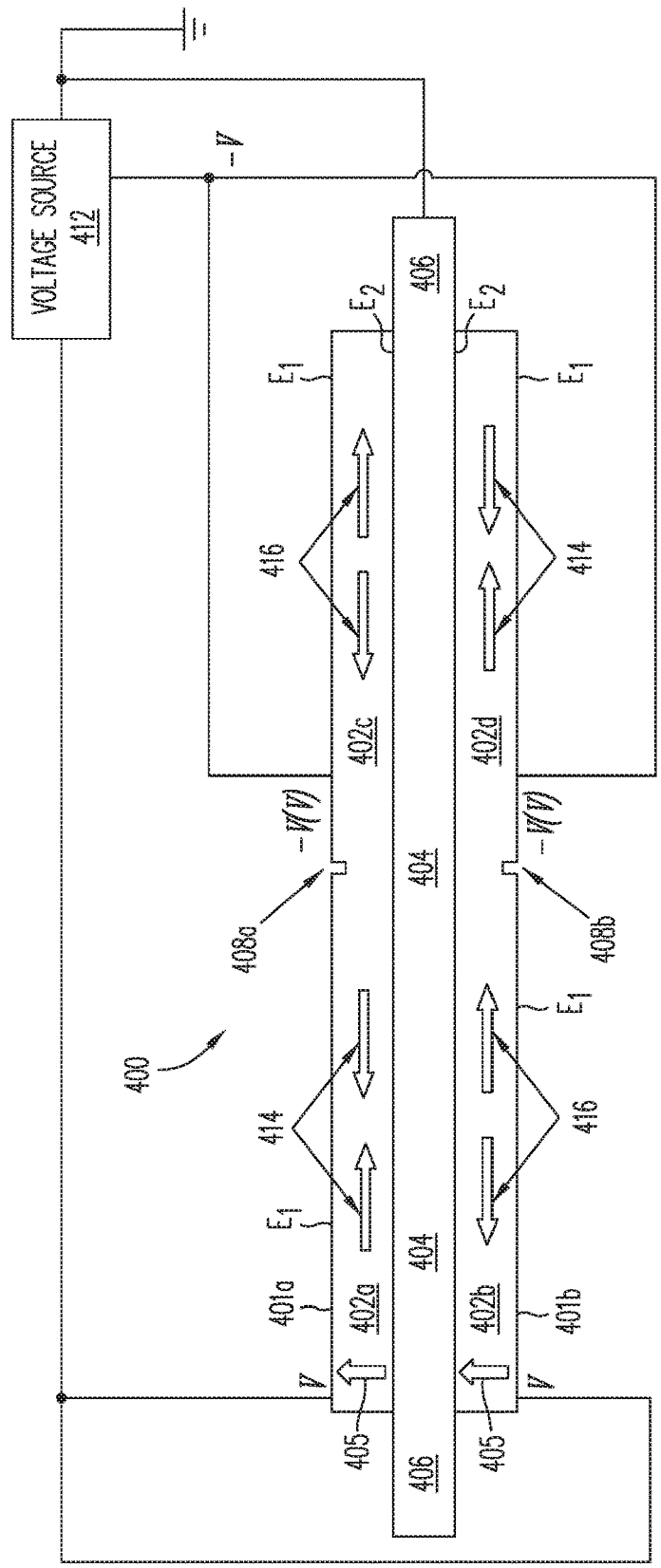
FIG. 4 is a diagram illustrating a cross-section of a bender bar transducer having two piezoelectric elements segmented into piezoelectric element segments, consistent with some embodiments.

FIG. 4 is a diagram illustrating a cross-section of a bender bar transducer 400 having two piezoelectric elements 401a and 401b. Each piezoelectric element 401 includes electrodes at least one of which is partitioned into two electrodes so that piezoelectric element 401 can be characterized as having two piezoelectric element segments or portions 402, each piezoelectric element segment or portion 402 with its own set of electrodes. Thus, piezoelectric element 401a is partitioned into segments 402a and 402c, each with its own electrode $E_1$. Likewise, piezoelectric element 401b is partitioned into segments 402b and 402d each with its own electrode $E_1$, consistent with some embodiments. As described herein, each electrode $E_1$, paired with an electrode $E_2$, forms a "set" of electrodes for a given segment or portion 402, even if adjacent segments or portions have one common electrode, such as $E_2$. As shown in FIG. 4, bender bar transducer 400 includes piezoelectric elements 401a and 401b attached to substrate element 404. Piezoelectric elements 401a and 401b may have a polarization indicated by arrows 405. Substrate element 404 may have fixed ends 406 on either end of substrate element 404, which fixed ends may be attached to a supporting structure (not shown).

In some embodiments, piezoelectric elements 401a and 401b may include a partition 408a and 408b, respectively, which introduces a break or separation in an electrode so as to form electrode sets $E_1$, $E_2$ for each piezoelectric element 401. Thus, it will be appreciated that while each piezoelectric element 401 may be a single piezoelectric body (as opposed to separate piezoelectric bodies 302a, 302c as described with respect to FIG. 3) the introduction of the partition 408 results in segments or portions 402 that can respond as separate piezoelectric bodies. Partitions 408a and 408b may be manufactured into piezoelectric elements 401a and 401b with a separate electrode applied to the divided outer surface during manufacturing, or a single electrode may be formed on the outer surface of piezoelectric element 401 during manufacturing and thereafter partition 408 may be introduced to form the respective segments or portions. Partitions 408a and 408b may be blank slots manufactured into the electrodes or physical separations or breaks manufactured into the electrodes. Piezoelectric elements 401a and 401b may be further manufactured to be polarized in the directions shown by arrows 410a and 410b. In some embodiments, pairs of electrodes $E_1$, $E_2$ for adjacent piezoelectric segments 402 may include a common electrode. For example, in some embodiments, $E_2$ for adjacent piezoelectric segments 402a, 402c may be the same or a common electrode, while electrodes $E_1$ of adjacent piezoelectric segments 402a, 402c are different or distinct from one another as separated by partition 408a.

A voltage source 412 may be coupled to bender bar transducer 400 to provide an alternating voltage V oscillating at a frequency f, with V applied to elements 402a and 402b, and anti-phase voltage −V, or same phase voltage V, to elements 402c and 402d. In some embodiments, the voltage may be a voltage between about 100 V and about 10,000 V oscillating at a frequency f of about 500 Hz to about 10 kHz. In some embodiments, voltage V may have a frequency between about 500 Hz and about 6 kHz. Voltage source 412 may be coupled to bender bar transducer 400 to provide voltage V to each of piezoelectric element segments 402a-d, and anti-phase voltage −V to piezoelectric element segments 402c and 402d. When voltage V applied to piezoelectric element segments 402a and 402b is positive, a first piezoelectric stress indicated by arrows 414 may be induced in piezoelectric element segment 402a, and a second piezoelectric stress indicated by arrows 416 may be induced in piezoelectric element segment 402b causing piezoelectric element segment 402a to contract while piezoelectric element segment 402b expands. Applying anti-phase voltage −V to piezoelectric element segments 402c and 402d induces second piezoelectric stress indicated by arrows 416 in piezoelectric element segment 402c, and first piezoelectric stress indicated by arrows 414 in piezoelectric element segment 402d causing piezoelectric element segment 402d to contract while piezoelectric element segment 402c expands. The expansion of piezoelectric element segments 402b and 402c and the contraction of piezoelectric element segments 402a and 402d over time may cause substrate element 404 to bend over time such that bender bar transducer 400 vibrates at the frequency f. Moreover, the vibration caused by the expansion of piezoelectric element segment 402b and 402c and the contraction of piezoelectric element segment 402a and 402d excites the second resonance mode shown in FIG. 2B.

Applying same phase voltage V to piezoelectric element segments 402c and 402d may then produce the same vibrations as in FIG. 1 to excite the first and third resonance modes shown in FIGS. 2A and 2C. Consequently, by alternating the application of same phase voltage V and anti-phase voltage −V to piezoelectric element segments 402c and 402d while applying voltage V to piezoelectric element segments 402a and 402b, at least three resonance modes may be excited in bender bar transducer 400. By exciting at least three resonance modes in bender bar transducer 400, bender bar transducer 400 may produce additional acoustic energy or pressure than bender bar transducer 100, which may allow for greater utility of bender bar transducer 400 in acoustic applications. Although, only three modes are discussed as being excited, other modes may also be excited in some embodiments. Moreover, although bender bar transducer 400 shown in FIG. 4 includes both piezoelectric element 401a and 401b, in some embodiments bender bar transducer 400 may only include a single piezoelectric element 401a or 401b. Applying alternating voltage V and anti-phase voltage −V to the single piezoelectric element 401a or 401b as described above would also excite at least three resonance modes, the amplitude of the excited modes would be much less, resulting in less acoustic energy or pressure being produced.

Figure 5:
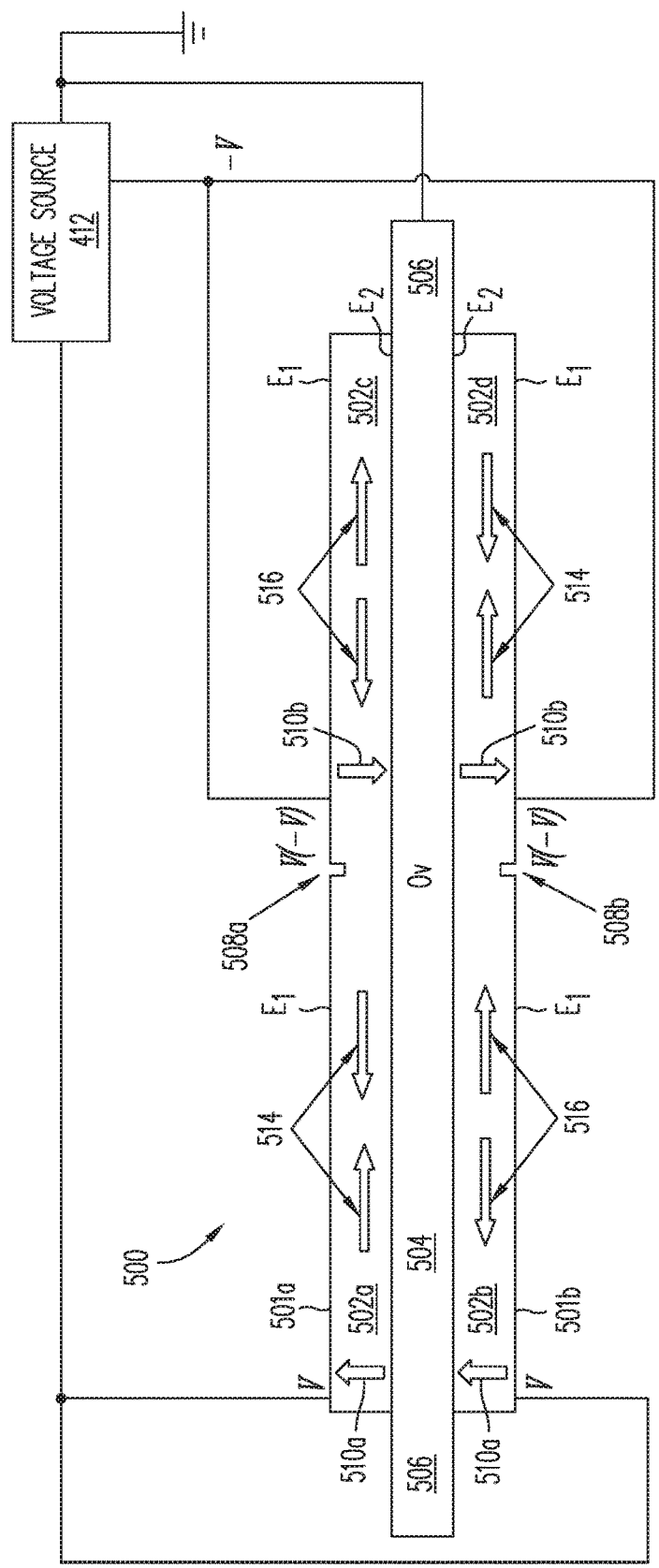
FIG. 5 is a diagram illustrating a cross-section of a bender bar transducer having two piezoelectric elements segmented into piezoelectric element segments, consistent with some embodiments.

FIG. 5 is a diagram illustrating a cross-section of a bender bar transducer 500 having two piezoelectric elements 501a and 501b that are each segmented into two piezoelectric element segments 502, namely segments 502a and 502c with respect to piezoelectric element 501a and segments 502b and 502d with respect to piezoelectric element 501b, consistent with some embodiments. As shown in FIG. 5, bender bar transducer 500 includes piezoelectric elements 501a and 501b attached to substrate element 504. Piezoelectric elements 501a and 501b may each include electrodes $E_1$, $E_2$ added to the piezo material during manufacture for receiving a voltage and producing an electric field in the piezo material. Substrate element 504 may have fixed ends 506 on either end of substrate element 504, which fixed ends 506 may be attached to a supporting structure (not shown).

Similar to bender bar 400 shown in FIG. 4, piezoelectric elements 501a and 501b may respectively include a segment 508a and 508b. Each piezoelectric element 501 includes electrodes at least one of which is partitioned into two electrodes so that piezoelectric element 501 can be characterized as having two piezoelectric element segments or portions 502, each with its own set of electrodes. Thus, piezoelectric element 501a is partitioned into segments 502a and 502c, each with its own electrode $E_1$. Likewise, piezoelectric element 501b is partitioned into segments 502b and 502d, each with its own electrode $E_1$. As described herein, each electrode $E_1$, paired with an electrode $E_2$, forms a "set" of electrodes for a given segment or portion 502, even if adjacent segments or portions have one common electrode, such as $E_2$. A partition 508 introduces a break or separation in an electrode of a piezoelectric element 501 to create piezoelectric element segments or portions 502. In some embodiments, partitions 508a and 508b may be manufactured into piezoelectric elements 501a and 501b during the formation of the piezoelectric material into a particular shape, after which individual electrodes $E_1$ may be formed on the respective outer surfaces of the segments. In some embodiments, a single electrode is applied to a piezoelectric shape during formation of piezoelectric element 501 and a partition 508 is subsequently cut or otherwise formed in the single electrode, to yield two E1 electrodes for the piezoelectric element 501. Partitions 508a and 508b may be blank slots manufactured into the electrodes or physical separations or breaks manufactured into the electrodes. In some embodiments, pairs of electrodes $E_1$, $E_2$ for adjacent piezoelectric segments or portions 502 may include a common electrode. For example, in some embodiments, $E_2$ for to adjacent piezoelectric segments 502a, 502c divided by partition 508 may be the same or a common electrode, while electrodes $E_1$ of adjacent piezoelectric segments 502a, 502c are different or distinct from one another as separated by partition 508a.

In some embodiments, piezoelectric elements 501a and 501b may be further manufactured such that each segment of piezoelectric elements 501a and 501b has a different polarization. For example, as shown in FIG. 5, piezoelectric element segments 502a and 502b may have a first polarization indicated by arrows 510a, and piezoelectric element segments 502c and 502d may have a second polarization indicated by arrows 510b.

A voltage source 512 may be coupled to bender bar transducer 500 to provide an alternating voltage V between about 100 V and about 10,000 V oscillating at a frequency f of about 500 Hz to about 10 kHz and in some embodiments between about 500 Hz and about 6 kHz. Voltage source 512 may be coupled to bender bar 500 to provide alternating voltage V to each of piezoelectric element segments 502a-d. In some embodiments, the application of alternating voltage V to piezoelectric element segments 502a-d may induce a first piezoelectric stress indicated by arrows 514 in piezoelectric element segments 502a and 502d, and a second piezoelectric stress indicated by arrows 516 in piezoelectric element segments 502b and 502c. The first and second induced piezoelectric stresses may cause piezoelectric element segment 502a and 502d to contract while piezoelectric element segments 502b and 502c expand. The expansion of piezoelectric element segments 502b and 502c and the contraction of piezoelectric element segments 502a and 502d over time may cause substrate element 504 to bend over time such that bender bar 500 vibrates at the frequency f. Moreover, the vibration caused by the expansion of piezoelectric element segment 502b and 502c and the contraction of piezoelectric element segment 502a and 502d excites the second resonance mode shown in FIG. 2B.

Voltage source 512 may be further configured to apply both voltage V and anti-phase voltage −V. When voltage V applied to all piezoelectric element segments 502a-d is positive, voltage V may cause first piezoelectric stress 514 and second piezoelectric stresses 516 as shown in FIG. 5. Therefore, the second resonance mode can be excited by the alternating voltage V. When V is applied to segments 502a and 502b, while anti-phase voltage −V is applied to segments 502c and 502d, the first and third resonance modes shown in FIGS. 2A and 2C will be excited. Consequently, with application of voltage V to element segments 502a and 502b, and alternating the application of voltage V and anti-phase voltage −V to piezoelectric element segments 502c and 502d, at least three resonance modes may be excited in bender bar 500. By exciting at least three resonance modes in bender bar transducer 500, bender bar transducer 500 may produce additional acoustic energy or pressure than bender bar 100, which may allow for greater utility of bender bar transducer 500 in acoustic applications. Although, only three modes are discussed as being excited, other modes may also be excited in some embodiments.

Moreover, although bender bar transducer 500 shown in FIG. 5 includes both piezoelectric element 501a and 501b, in some embodiments bender bar transducer 500 may only include a single piezoelectric element 501a or 501b. Applying alternating voltage V to the single piezoelectric element 501a or 501b as described above would also excite three modes, the amplitude of the excited modes would be much less, resulting in less acoustic energy or pressure being produced. Furthermore, although bender bar transducer 500 is similar to bender bar transducer 400 in that they both utilize segmented piezoelectric elements, bender bar transducer is more easily applied in practice and more difficult to manufacture than bender bar transducer 400.

Figure 6A:
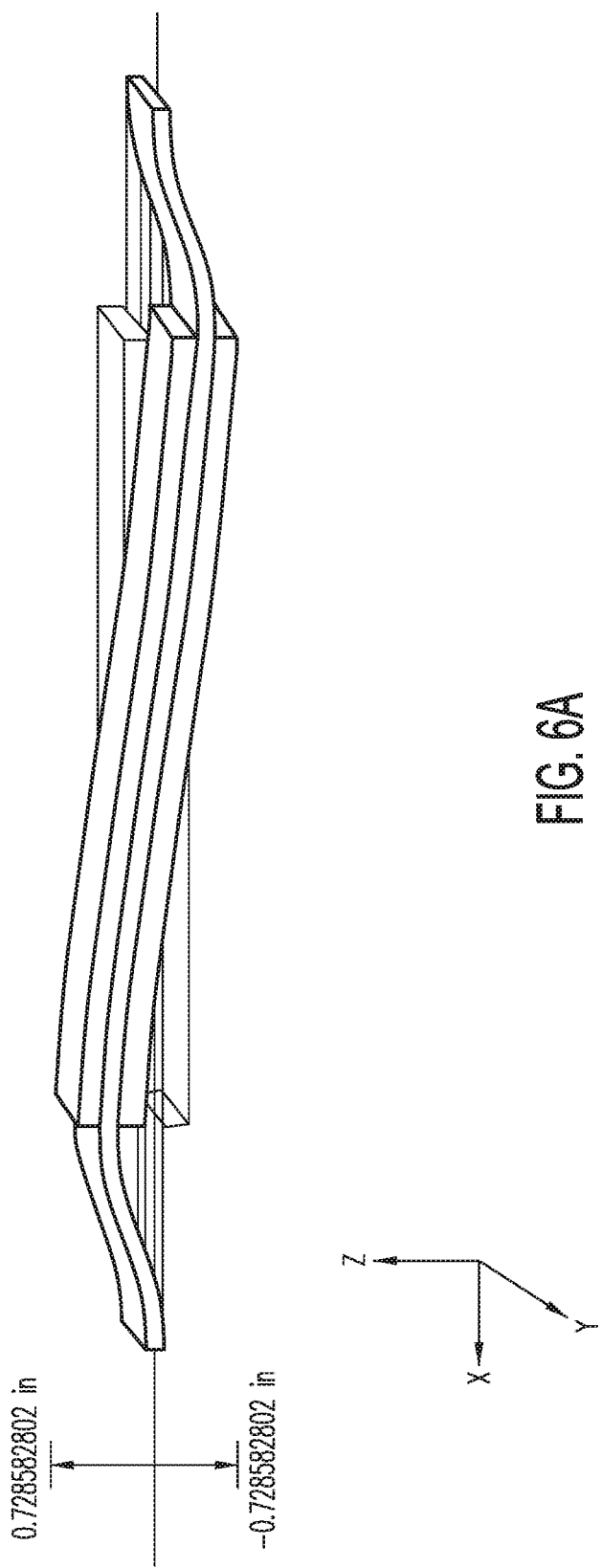
FIG. 6A is a graph illustrating the displacement of a bender bar transducer vibrating in the second resonance mode.
Figure 6B:
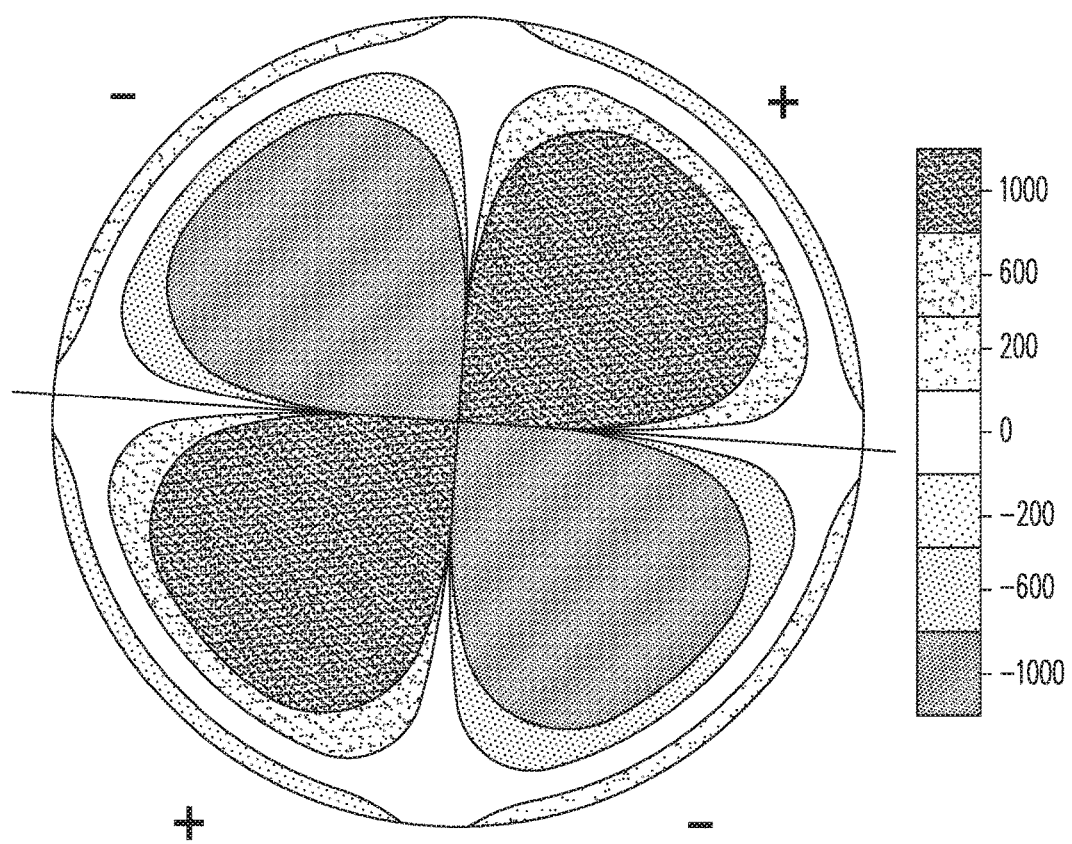
FIG. 6B is a graph illustrating the acoustic pressure or energy generated by the bender bar transducer while vibrating in the second resonance mode, consistent with some embodiments.

FIG. 6A is a graph illustrating the displacement of a bender bar transducer vibrating in the second resonance mode, and FIG. 6B is a graph illustrating a cross-section of the acoustic pressure generated by the bender bar transducer while vibrating in the second resonance mode, consistent with some embodiments. For the purpose of illustration, the graph shown in FIGS. 6A and 6B illustrate bender bar transducer 400 as it vibrates in the second resonance mode and the acoustic pressure produced by bender bar transducer 400 having a voltage V of about 1000 V applied thereto. However, the graphs for bender bar transducers 300 and 500 would be represented similarly. Moreover, although FIG. 6B illustrates the acoustic pressure generated by bender bar transducer 400 as it vibrates in the second resonance mode, FIG. 6B may also provide an approximation of the acoustic energy generated by bender bar transducer 400 as it vibrates in the second resonance mode since acoustic energy is proportional to the square of acoustic pressure.

As shown in FIG. 6A, as bender bar transducer 400 vibrates in the second resonance mode, portions of bender bar transducer 400 are displaced from a resting position from about 0 to about 0.728582802 inches (about 0 to about 1.8506 cm), shown on the z-axis, along the length of bender bar 400 shown in the x-axis. In particular, displacement on bender bar transducer 400 appears to be the greatest at ends of piezoelectric elements 401a and 401b, while displacement on bender bar transducer 400 appears to be the smallest at fixed ends 406 and segments 408a and 408b.

FIG. 6B illustrates a cross-section of the generated acoustic pressure in a 1 meter sphere surrounding bender bar transducer 400, which may vary between about −1000 kPa and about 1000 kPa when the frequency f is 1.017 kHz and the applied voltage V is about 1000 V. As shown in FIG. 6B, the asymmetry of the second resonance mode excited by bender bar 400 generates acoustic pressure and energy in directions corresponding to four quadrants of the 1 meter sphere surrounding bender bar transducer 400, with alternating positive and negative pressure through quadrants. However, the generated acoustic pressure is minimal at the center and transverse direction of bender bar 400. Bender bar transducer 400 vibrating at the second resonance mode may, thus, produce acoustic pressure or energy that is greatest in the directions corresponding to the four quadrants of the sphere surrounding bender bar transducer 400. This directionality of the generated acoustic pressure or energy may be beneficial when used as an acoustic transmitter in a downhole tool, as the sensors may generally be positioned along the tool axis, which is typically the same as the transverse direction of bender bar transducer 400, minimizing propagation along the tool axis while producing acoustic energy at a desirable incident angle into the downhole. In some embodiments, the acoustic energy produced by bender bar transducer 400 (or bender bar transducers 300 and 500) exciting the second resonance mode may further excite flexural waves in the downhole. In some embodiments, exciting flexural waves in the downhole may allow for using bender bar transducers 300, 400, or 500 for formation characterization applications.

Figure 7A:
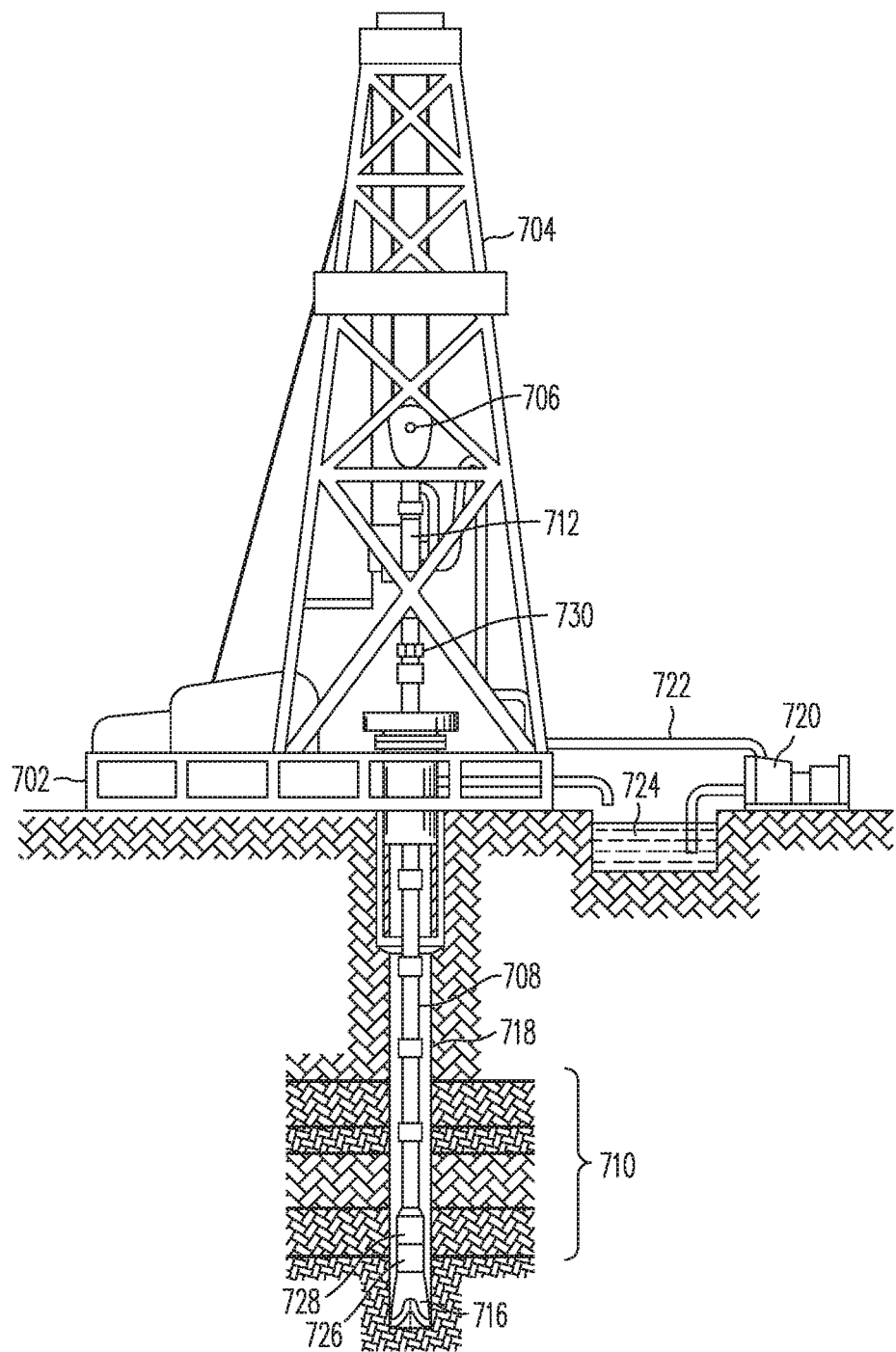
FIGS. 7A and 7B illustrate acoustic transducers utilized in a drilling and wireline application, consistent with some embodiments.
Figure 7B:
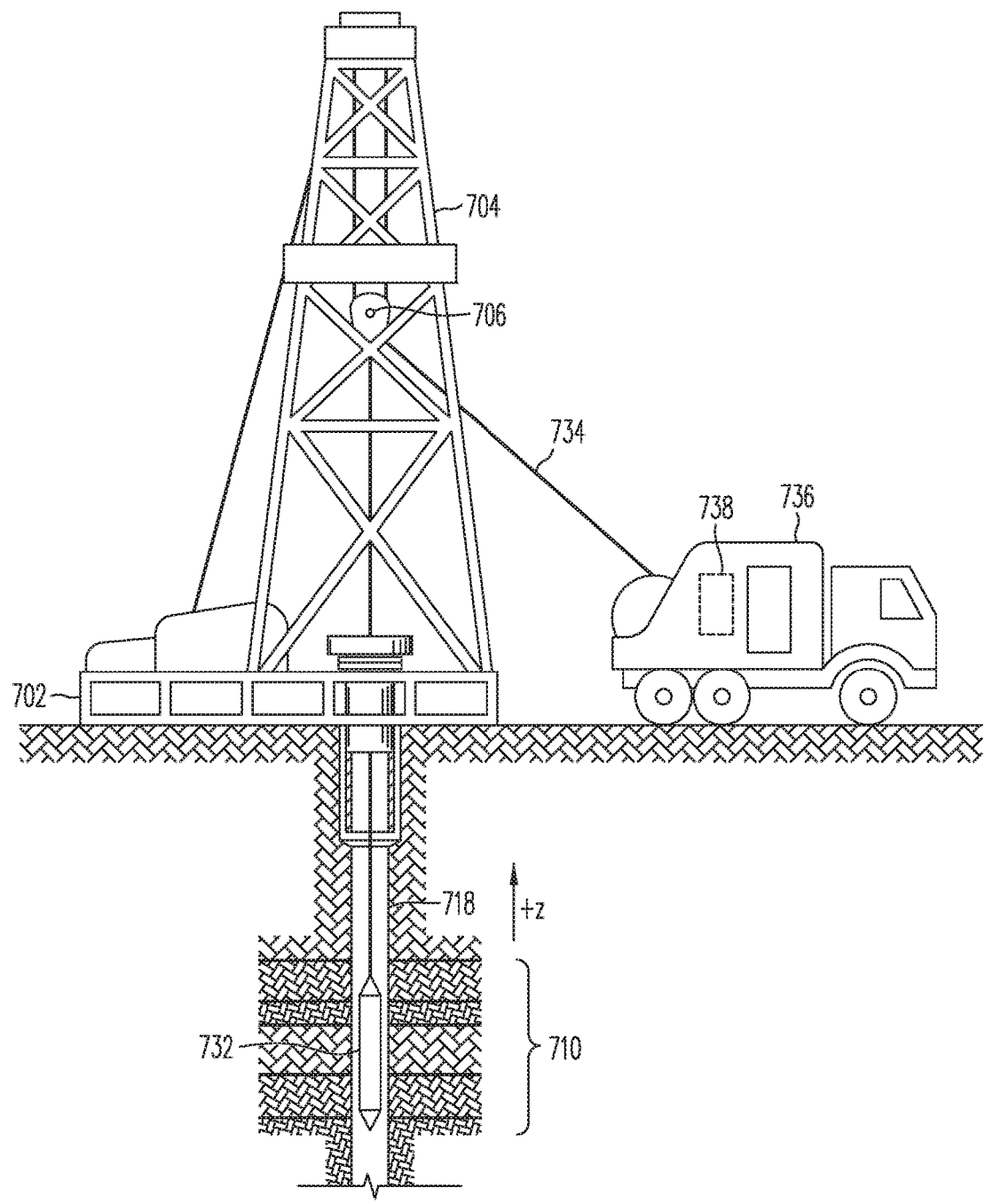

FIGS. 7A and 7B illustrate acoustic transducers utilized in a drilling and wireline application, consistent with some embodiments. As shown in FIG. 7A, a drilling platform 702 may be equipped with a derrick 704 that supports a hoist 706 for raising and lowering a drill string 708 through various formations 710. Hoist 706 suspends a top drive 712 suitable for rotating drill string 708 and lowering it through a well head 714. In some embodiments, drill bit 716 may be coupled to the lower end of drill string 708. As drill bit 716 rotates, it may create a wellbore 718 that passes through various formations 710. A pump 720 may circulate drilling fluid through a supply pipe 722 to top drive 712, down through the interior of drill string 708, through orifices in drill bit 716, back to the surface via the annulus around drill string 708, and into a retention pit 724. In some embodiments, the drilling fluid may transport cuttings from the borehole into pit 724 and may aid in maintaining the integrity of wellbore 718. Various materials can be used for drilling fluid, including, but not limited to, a salt-water based conductive mud.

An acoustic logging tool 726 may be integrated into the bottom-hole assembly near drill bit 716. In some embodiments, logging tool 726 may be a logging while drilling (LWD) tool utilizing a bender bar acoustic transducer as described herein, such as bender bar transducers 300, 400, or 500. In some embodiments, logging tool 726 may be utilized in a wireline or tubing-convey logging application. Moreover, logging tool 726 may be adapted to perform logging operations in both open and cased hole environments.

Still referring to FIG. 7A, as drill bit 716 extends wellbore 718 through formations 710, logging tool 726 may collect acoustic measurement signals relating to various formation properties, such as formation slowness (the inverse of acoustic speed) and anisotropy, from which pore pressure, porosity, and other formation property determinations can be made. In some embodiments, logging tool 726 may be capable of collecting acoustic signals used to image the formation. In some embodiments, logging tool 726 may also be capable of collecting acoustic measurement signals used to determine the tool orientation and various other drilling conditions. In some embodiments, logging tool 726 may take the form of a drill collar, i.e., a thick-walled tubular that provides weight and rigidity to aid the drilling process. A telemetry sub 728 may be included to transfer images and measurement data/signals to a surface receiver 730 and to receive commands from the surface. In some embodiments, telemetry sub 728 does not communicate with the surface, but rather stores logging data for later retrieval at the surface when the logging assembly is recovered.

Logging tool 726 may include a system control center ("SCC"), along with necessary processing/storage/communication circuitry, that is communicably coupled to one or more acoustic transmitters and/or receivers (not shown) utilized to acquire formation measurement signals reflecting formation parameters. In some embodiments, once the measurement signals are acquired, the SCC calibrates the measurement signals and communicates the data back uphole and/or to other assembly components via telemetry sub 728. In some embodiments, the SCC may be located at a remote location away from logging tool 726, such as the surface or in a different borehole, and performs the processing accordingly. These and other variations within the present disclosure will be readily apparent to those ordinarily skilled in the art having the benefit of this disclosure.

FIG. 7B illustrates an embodiment whereby an acoustic transducer is utilized in a wireline application. At various times during the drilling process, drill string 708 (cf. FIG. 7A) may be removed from the borehole. Once drill string 708 has been removed, logging operations can be conducted using a wireline logging sonde 732, i.e., a probe suspended by a cable 734 having conductors for transporting power to sonde 732 and telemetry from sonde 732 to the surface. Wireline logging sonde 732 may include acoustic logging tool 726 (cf. FIG. 7A) as described herein to transmit and/or receive acoustic forces. In some embodiments, wireline logging sonde 732 may include acoustic logging tool 726 including bender bar transducers 300, 400, or 500, as described herein. A logging facility 736 collects measurements from logging sonde 732, and may include a computer system 738 for processing and storing the measurements gathered by the transmitter/receivers.

Figure 8:
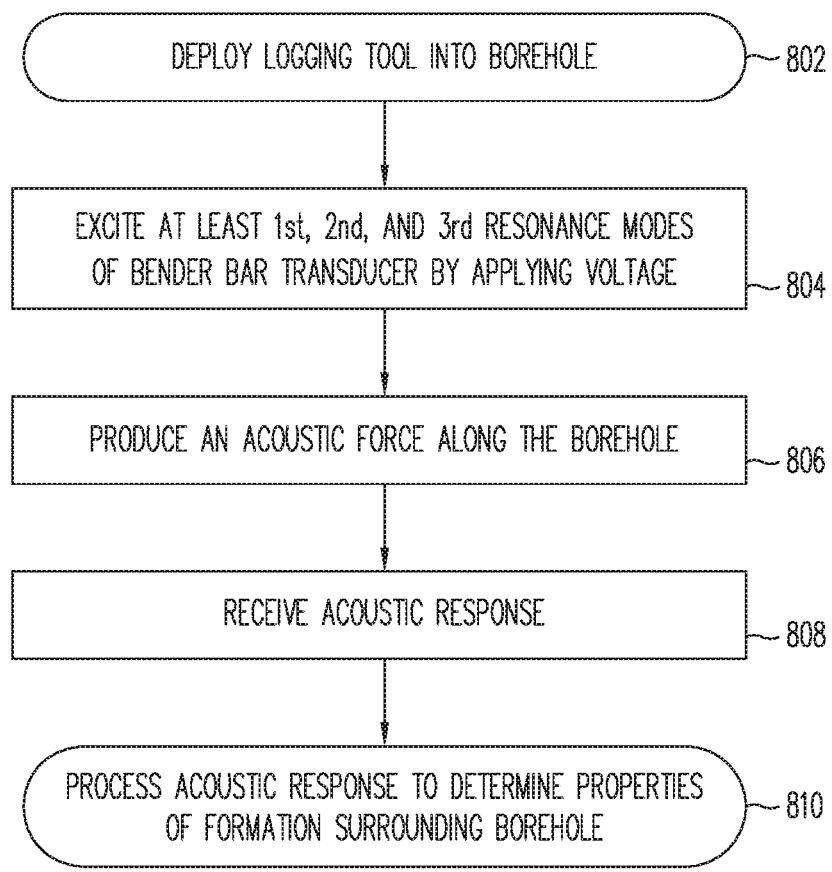
FIG. 8 is a process for determining properties of a formation, consistent with some embodiments.

FIG. 8 is a process 800 for determining properties of a formation, consistent with some embodiments. For the purpose of illustration, FIG. 8 will be described with reference to any of FIGS. 1A, 1B, 2A-2C, 3-5, 6A, 6B, 7A, and 7B. Process 800 may begin when logging tool 726 is deployed into borehole 718 (802). In some embodiments, logging tool 726 may be integrated into the bottom-hole assembly near drill bit 716, be in a drill collar, or be included in a wireline logging sonde 732. Moreover, logging tool 726 may include a bender bar transducer capable of exciting at least a first, second, and third resonance mode at a frequency of an applied voltage. That is, logging tool 726 may include bender bar transducer 300, 400, or 500.

Process 800 may continue by exciting at least a first, second, and third resonance mode of bender bar transducer 300, 400, or 500 by applying an alternating voltage (804). Exciting the at least first, second, and third resonance modes may then produce an acoustic force along borehole 718 (806). An acoustic response may be received from borehole 718 (808). In some embodiments, the acoustic response may include compressional waves (P-wave), shear waves (S-wave), and Stoneley waves. Moreover, the acoustic response may be received by one or more receivers located at a distance from bender bar transducer 300, 400, or 500 of logging tool. The received acoustic response may then be processed to determine properties of the formation surrounding the borehole (810). In some embodiments telemetry sub 728 may collect and/or transmit the received acoustic response to a surface receiver 730 for processing. In some embodiments, an SCC may process the received acoustic response. In additional embodiments, a logging facility 736 having one or more computing systems 738 may process the acoustic responses.

Embodiments consistent with this disclosure may provide an improved bender bar transducer capable of exciting a second resonance mode in addition to the first and third resonance modes. Consequently, the improved bender bar transducer consistent with the disclosed embodiments may provide a stronger and directional acoustic output that may provide improved acoustic downhole measurements.

Thus, an acoustic transducer has been described. The acoustic transducer may generally include a substrate element; a first piezoelectric element coupled to a first side of the substrate element, the first piezoelectric element comprising a first portion having a set of electrodes and a second portion having a set of electrodes; and a second piezoelectric element coupled to a second side of the substrate element, the second piezoelectric element comprising a first portion having a set of electrodes and a second portion having a set of electrodes. Embodiments of the acoustic transducer may include any one or more of the following, alone or in combination:

Application of a first voltage to the first portion of the first piezoelectric element causes a first stress on the first portion of the first piezoelectric element; application of a second voltage to the second portion of the first piezoelectric element causes a second stress on the second portion of the first piezoelectric element; application of the first voltage to the first portion of the second piezoelectric element causes the second stress on the first portion of the second piezoelectric element; and application of the second voltage to the second portion of the second piezoelectric element causes the first stress on the second portion of the second piezoelectric element.

The substrate element comprises fixed ends.

The second portion of the first piezoelectric element comprises a third piezoelectric element and the second portion of the second piezoelectric element comprises a fourth piezoelectric element.

The second voltage comprises an anti-phase component of the first voltage.

Application of the first voltage to the first, the second, the third, and the fourth piezoelectric elements cause the acoustic transducer to vibrate to produce at least a first resonance mode and a third resonance mode.

The first portion and the second portion of the first piezoelectric element are defined by a first partition in a first electrode coupled to the first piezoelectric element; and the first portion and the second portion of the second piezoelectric element are defined by a second segment in a second electrode coupled to the second piezoelectric element.

The second voltage comprises an anti-phase component of the first voltage.

Application of the first voltage to the second portion of the first piezoelectric element and the second portion of the second piezoelectric element cause the acoustic transducer to vibrate to produce at least a first resonance mode and a third resonance mode.

The second portion of the first piezoelectric element has a different polarization than the first portion; and the second portion of the second piezoelectric element has a different polarization than the first portion of the second piezoelectric element.

The second voltage comprises a same phase component of the first voltage.

Application of a voltage source to the second portion of the first piezoelectric element and the second portion of the second piezoelectric element a causes the acoustic transducer to vibrate to produce at least a first resonance mode and a third resonance mode, wherein the voltage source comprises an anti-phase component of the first voltage coupled to the acoustic transducer.

A first piezoelectric element and a second piezoelectric element comprise at least one of lead zirconate titanate (PZT), barium titanate (BaTiO$_3$), gallium orthophosphate (GaPO$_4$), tourmaline, and quartz.

The substrate element is formed of an inert material.

The substrate element is formed of non-piezoelectric material.

At least one electrode of the first portion of the first piezoelectric element is different from at least one electrode of the second portion of the first piezoelectric element.

At least one electrode of the first portion of the second piezoelectric element is different from at least one electrode of the second portion of the second piezoelectric element.

At least one electrode of the first portion of the first piezoelectric element is the same as at least one electrode of the second portion of the first piezoelectric element.

At least one electrode of the first portion of the second piezoelectric element is the same as at least one electrode of the second portion of the second piezoelectric element.

Thus, an acoustic logging method has been described. The acoustic logging method may generally include deploying an acoustic logging tool into a borehole; exciting at least a first, second, and third resonance modes of the acoustic logging tool to produce an acoustic force along the borehole; and processing a received acoustic response to the produced acoustic force to determine properties of formations surrounding the borehole. Likewise, a method of utilizing an acoustic transducer may generally include applying a first voltage to a first portion of a first piezoelectric element of the acoustic transducer to cause a first stress on the first portion of the first piezoelectric element; applying a second voltage to a second portion of a first piezoelectric element to cause a second stress on the second portion of the first piezoelectric element; applying the first voltage to a first portion of a second piezoelectric element to cause the second stress on the first portion of the second piezoelectric element; and applying the second voltage to a second portion of a second piezoelectric element to cause the first stress on the second portion of the second piezoelectric element. Likewise, a method of utilizing an acoustic transducer may generally include bending a surface of a piezoelectric transducer in a first direction by applying a first voltage having a first charge to a first piezoelectric element disposed on said surface and by applying a second voltage having a second charge opposite the first charge to a second piezoelectric element disposed on said surface. Embodiments of the foregoing methods may include any one or more of the following, alone or in combination:

Deploying an acoustic logging tool having a substrate element; a first piezoelectric element coupled to a first side of the substrate element, the first piezoelectric element comprising a first portion having a set of electrodes and a second portion having a set of electrodes; and a second piezoelectric element coupled to a second side of the substrate element, the second piezoelectric element comprising a first portion having a set of electrodes and a second portion having a set of electrodes Exciting at least a first, second, and third resonance modes of the acoustic logging tool comprises: applying a first voltage to a first portion and a second portion of a first piezoelectric element and a first portion and a second portion of a second piezoelectric element; and applying a second voltage to a second portion of the first piezoelectric element and a second portion of the second piezoelectric element.

Applying a second voltage comprises applying an anti-phase component of the first voltage.

Deploying an acoustic logging tool on a wireline.

Deploying an acoustic logging tool coupled to a drill string.

The second voltage comprises an anti-phase component of the first voltage.

Application of the first voltage to the first and second portions of the first piezoelectric element and to the first and second portions of the second piezoelectric element cause the acoustic transducer to vibrate to produce at least a first resonance mode and a third resonance mode.

The second portion of the first piezoelectric element has a different polarization than the first portion; and the second portion of the second piezoelectric element has a different polarization than the first portion of the second piezoelectric element.

The second voltage comprises a same phase component of the first voltage.

Application of a voltage source to the second portion of the first piezoelectric element and the second portion of the second piezoelectric element a causes the acoustic transducer to vibrate to produce at least a first resonance mode and a third resonance mode, wherein the voltage source comprises an anti-phase component of the first voltage coupled to the acoustic transducer.

Identifying at least a first and second resonant frequency for the piezoelectric transducer; exciting the transducer at each of the frequencies to bend a surface of the transducer in a first direction, wherein exciting the transducer comprises: at the first frequency, applying the first voltage having the first charge to the first piezoelectric element disposed on said surface and by applying a voltage having the first charge to the second piezoelectric element disposed on said surface; and at the second frequency, applying the first voltage having the first charge to the first piezoelectric element disposed on said surface and by applying a second voltage having a second charge opposite the first charge to the second piezoelectric element disposed on said surface.

The examples provided above are exemplary only and are not intended to be limiting. One skilled in the art may readily devise other systems consistent with the disclosed embodiments which are intended to be within the scope of this disclosure. As such, the application is limited only by the following claims.

What is claimed is:

1. An acoustic transducer, comprising:
a substrate element;
a first piezoelectric element coupled to a first side of the substrate element, the first piezoelectric element comprising a first portion having a set of electrodes and a second portion having a set of electrodes;
a second piezoelectric element coupled to a second side of the substrate element, the second piezoelectric element comprising a first portion having a set of electrodes and a second portion having a set of electrodes; and
a voltage source coupled to the first and second piezoelectric element to provide:
application of a first alternating voltage to the acoustic transducer to thereby drive the acoustic transducer to vibrate at a first and third resonance mode that are symmetric with respect to a central plane that passes through the first and second piezoelectric elements; and
application of a second anti-phase voltage to the acoustic transducer to thereby drive the acoustic transducer to vibrate at a second resonance mode having a frequency between the first and third resonance modes and that is asymmetric with respect to the central plane, the second anti-phase voltage having an anti-phase component of the first alternating voltage.

2. The acoustic transducer of claim 1, wherein:
application of the first alternating voltage to the first portion of the first piezoelectric element causes a first stress on the first portion of the first piezoelectric element;
application of the second anti-phase voltage to the second portion of the first piezoelectric element causes a second stress on the second portion of the first piezoelectric element;

application of the first alternating voltage to the first portion of the second piezoelectric element causes the second stress on the first portion of the second piezoelectric element; and
application of the second anti-phase voltage to the second portion of the second piezoelectric element causes the first stress on the second portion of the second piezoelectric element.

3. The acoustic transducer of claim 1, wherein the substrate element comprises fixed ends.

4. The acoustic transducer of claim 1, wherein the second portion of the first piezoelectric element comprises a third piezoelectric element and the second portion of the second piezoelectric element comprises a fourth piezoelectric element.

5. The acoustic transducer of claim 4, wherein application of the first alternating voltage to the first, the second, the third, and the fourth piezoelectric elements cause the acoustic transducer to vibrate to produce at least the first and third resonance modes.

6. The acoustic transducer of claim 1, wherein:
the first portion and the second portion of the first piezoelectric element are defined by a first partition in a first electrode coupled to the first piezoelectric element, the first partition being a separation extending partially into the first piezoelectric element; and
the first portion and the second portion of the second piezoelectric element are defined by a second partition in a second electrode coupled to the second piezoelectric element, the second partition being a separation extending partially into the second piezoelectric element.

7. The acoustic transducer of claim 6, wherein:
the second portion of the first piezoelectric element has a different polarization than the first portion; and
the second portion of the second piezoelectric element has a different polarization than the first portion of the second piezoelectric element.

8. The acoustic transducer of claim 7, wherein the second anti-phase voltage comprises a same phase component of the first voltage.

9. The acoustic transducer of claim 1, wherein application of the first alternating voltage to the second portion of the first piezoelectric element and the second portion of the second piezoelectric element cause the acoustic transducer to vibrate to produce at least the first and third resonance modes.

10. The acoustic transducer of claim 1, wherein the first piezoelectric element and the second piezoelectric element comprise at least one of lead zirconate titanate (PZT), barium titanate ($BaTiO_3$), gallium orthophosphate ($GaPO_4$), tourmaline, and quartz and wherein the substrate element is formed of a non-piezoelectric material.

11. The acoustic transducer of claim 1, wherein at least one electrode of the first portion of the first piezoelectric element is different from at least one electrode of the second portion of the first piezoelectric element.

12. The acoustic transducer of claim 1, wherein at least one electrode of the first portion of the second piezoelectric element is different from at least one electrode of the second portion of the second piezoelectric element.

13. The acoustic transducer of claim 1, wherein at least one electrode of the first portion of the first piezoelectric element is the same as at least one electrode of the second portion of the first piezoelectric element.

14. The acoustic transducer of claim 1, wherein at least one electrode of the first portion of the second piezoelectric element is the same as at least one electrode of the second portion of the second piezoelectric element.

15. A method utilizing an acoustic logging tool within a borehole, the method comprising:
deploying the acoustic logging tool into the borehole;
application of a first alternating voltage to the acoustic logging tool to thereby drive the acoustic logging tool to vibrate at a first and third resonance mode that are symmetric with respect to a central plane that passes through an acoustic transducer of the acoustic logging tool;
application of a second anti-phase voltage to the acoustic logging tool to thereby drive the acoustic logging tool to vibrate at a second resonance mode having a frequency between the first and third resonance modes and that is asymmetric with respect to the central plane;
using at least the first, second, or third resonance modes of the acoustic logging tool to produce an acoustic force along the borehole; and
processing a received acoustic response to the produced acoustic force to determine properties of formations surrounding the borehole.

16. The method of claim 15, wherein deploying the acoustic logging tool comprises deploying an acoustic logging tool comprising:
a substrate element;
a first piezoelectric element coupled to a first side of the substrate element, the first piezoelectric element comprising a first portion having a set of electrodes and a second portion having a set of electrodes; and
a second piezoelectric element coupled to a second side of the substrate element, the second piezoelectric element comprising a first portion having a set of electrodes and a second portion having a set of electrodes.

17. The method of claim 16, wherein exciting at least a first, second, and third resonance modes of the acoustic logging tool comprises:
applying the first alternating voltage to the first portion and the second portion of the first piezoelectric element and the first portion and the second portion of the second piezoelectric element; and
applying the second anti-phase voltage to the second portion of the first piezoelectric element and the second portion of the second piezoelectric element.

18. The method of claim 15, wherein deploying the logging tool comprises deploying the logging tool on a wireline.

19. The method of claim 15, wherein deploying the logging tool comprises deploying the logging tool coupled to a drill string.

20. A method of utilizing an acoustic transducer comprising:
applying a first alternating voltage to a first portion of a first piezoelectric element of the acoustic transducer to cause a first stress on the first portion of the first piezoelectric element;
applying a second anti-phase voltage to a second portion of a first piezoelectric element to cause a second stress on the second portion of the first piezoelectric element, the second anti-phase voltage having an anti-phase component of the first alternating voltage;
applying the first alternating voltage to a first portion of a second piezoelectric element to cause the second stress on the first portion of the second piezoelectric element; and
applying the second anti-phase voltage to a second portion of a second piezoelectric element to cause the first stress on the second portion of the second piezoelectric element,
wherein the acoustic transducer is driven to vibrate at a first and third resonance mode that are symmetric with respect to a central plane that passes through the acoustic transducer and at a second resonance mode that is asymmetric with respect to the central plane.

21. The method of claim 20, wherein application of the first alternating voltage to the first and second portions of the first piezoelectric element and to the first and second portions of the second piezoelectric element cause the acoustic transducer to vibrate to produce at least a first resonance mode and a third resonance mode.

22. The method of claim 20, wherein:
the second portion of the first piezoelectric element has a different polarization than the first portion; and
the second portion of the second piezoelectric element has a different polarization than the first portion of the second piezoelectric element.

23. The method of claim 22, wherein the second anti-phase voltage comprises a same phase component of the first voltage.

24. A method of utilizing an acoustic transducer comprising:
bending a surface of a piezoelectric transducer in a first direction by applying a first alternating voltage to a first piezoelectric element disposed on said surface and by applying a second anti-phase voltage to a second piezoelectric element disposed on said surface,
wherein the acoustic transducer is driven to vibrate at a first and third resonance mode that are symmetric with respect to a central plane that passes through the acoustic transducer and at a second resonance mode that is asymmetric with respect to the central plane, the second resonance mode having a frequency between the first and third resonance modes.

25. The method of claim 24, further comprising:
identifying at least a first and second resonant frequency for the piezoelectric transducer;
exciting the transducer at each of the frequencies to bend a surface of the transducer in a first direction, wherein exciting the transducer comprises:
at the first frequency, applying the first alternating voltage to the first piezoelectric element disposed on said surface and the second piezoelectric element disposed on said surface; and
at the second frequency, applying the first alternating voltage to the first piezoelectric element disposed on said surface and applying a second anti-phase voltage to the second piezoelectric element disposed on said surface.

* * * * *